United States Patent
Ahmed

(10) Patent No.: US 9,177,791 B2
(45) Date of Patent: Nov. 3, 2015

(54) SYSTEMS AND METHODS FOR FORMING SEMICONDUCTOR DEVICES

(71) Applicant: Intermolecular, Inc., San Jose, CA (US)

(72) Inventor: Khaled Ahmed, Anaheim, CA (US)

(73) Assignee: Intermolecular, Inc., San Jose, CA (US)

(*) Notice: Subject to any disclaimer, the term of this patent is extended or adjusted under 35 U.S.C. 154(b) by 0 days.

(21) Appl. No.: 14/105,871

(22) Filed: Dec. 13, 2013

(65) Prior Publication Data
US 2015/0170912 A1 Jun. 18, 2015

(51) Int. Cl.
| | |
|---|---|
| *H01L 21/00* | (2006.01) |
| *H01L 21/02* | (2006.01) |
| *H01L 21/67* | (2006.01) |
| *C23C 14/02* | (2006.01) |
| *C23C 14/08* | (2006.01) |
| *C23C 14/34* | (2006.01) |
| *C23C 14/56* | (2006.01) |
| *C23C 16/02* | (2006.01) |
| *C23C 16/40* | (2006.01) |
| *C23C 16/455* | (2006.01) |
| *C23C 16/54* | (2006.01) |

(52) U.S. Cl.
CPC ........ *H01L 21/02565* (2013.01); *C23C 14/021* (2013.01); *C23C 14/08* (2013.01); *C23C 14/081* (2013.01); *C23C 14/086* (2013.01); *C23C 14/34* (2013.01); *C23C 14/568* (2013.01); *C23C 16/0227* (2013.01); *C23C 16/40* (2013.01); *C23C 16/403* (2013.01); *C23C 16/407* (2013.01); *C23C 16/45525* (2013.01); *C23C 16/54* (2013.01); *H01L 21/02488* (2013.01); *H01L 21/02554* (2013.01); *H01L 21/02658* (2013.01); *H01L 21/67017* (2013.01)

(58) Field of Classification Search
USPC ............. 438/104, 85, 722, 142, 431; 118/719
See application file for complete search history.

(56) References Cited

U.S. PATENT DOCUMENTS

| | | | |
|---|---|---|---|
| 7,547,641 B2 | 6/2009 | Ieong et al. | |
| 2010/0075508 A1* | 3/2010 | Seino et al. | 438/778 |
| 2012/0261754 A1* | 10/2012 | Cheng et al. | 257/347 |
| 2013/0105859 A1 | 5/2013 | Wang et al. | |

OTHER PUBLICATIONS

Agrawal et al.; A Unified Model for Insulator Selection to Form Ultra-Low Resistivity MIS Contacts to n-Si, n-Ge and n-InGaAs; Jul. 26, 2012; Applied Physics Letters; American Institute of Physics; pp. 1-5.

Pearton et al.; Characteristics of III-V Dry Etching in HBr-Based Discharges; Mar. 1992; Journal of the Electrochemical Society, vol. 139, No. 3; The Electrochemical Society, Inc.; pp. 856-864.

* cited by examiner

Primary Examiner — Timor Karimy

(57) ABSTRACT

Embodiments provided herein describe systems and methods for forming semiconductor devices. A semiconductor substrate is provided. The semiconductor substrate is exposed to bromine radicals, hydrogen radicals, or a combination thereof. An oxide layer is formed above the semiconductor substrate. The semiconductor substrate is held within a controlled atmosphere at least from the completion of the exposing of the semiconductor substrate to bromine radicals, hydrogen radicals, or a combination thereof and the beginning of the forming of the oxide layer.

15 Claims, 18 Drawing Sheets

SYSTEMS AND METHODS FOR FORMING SEMICONDUCTOR DEVICES

TECHNICAL FIELD

The present invention relates to semiconductor devices, such as transistors. More particularly, this invention relates to systems and methods for forming semiconductor devices.

BACKGROUND OF THE INVENTION

As manufacturers strive to meet currents demands for semiconductor device performance, the interfaces between layers or components within the devices are becoming increasingly important and are currently inhibiting the optimization of device performance.

One example of such an interface is that between the source and drain regions of metal-oxide-semiconductor field-effect transistors (MOSFETs) and the contacts formed to make electrical connections to them. Using conventional methods, the contact resistance between the source/drain and the contact is more than $1\times10^{-10}$ $n\Omega\text{-}cm^2$, which may be detrimental to the performance of advanced complimentary metal-oxide semiconductor (CMOS) device. Another example is the interface between the semiconductor substrate and the gate stack in transistors formed on "III-V" (e.g., gallium arsenide) and germanium substrates. Typically, the interface trap density (Dit) at these interfaces is greater than $1\times10^{11}$ $cm^2/eV$, which hinders the performance of such devices.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims, and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

Embodiments described herein provide systems and methods for forming semiconductor devices, such as transistors, in such a way to improve the electrical characteristics (e.g., contact resistance, interface trap density, etc.) of the interfaces formed between various components thereof. In some embodiments, the devices are at least partially formed in a processing system that exposes the substrate to bromine radicals, hydrogen radicals, or a combination thereof to perform a surface treatment (or dry clean) and transfers the substrate to a second processing chamber where an oxide is formed above the substrate.

The processing system is configured such that the semiconductor substrate is held within a controlled atmosphere at least from the completion of the exposing of the semiconductor substrate to bromine/hydrogen radicals and the beginning of the forming of the oxide layer. As a result, the system may prevent a native oxide and/or hydrocarbons from forming on the surface of the substrate, which may otherwise hinder the performance of the device.

Figure 1:
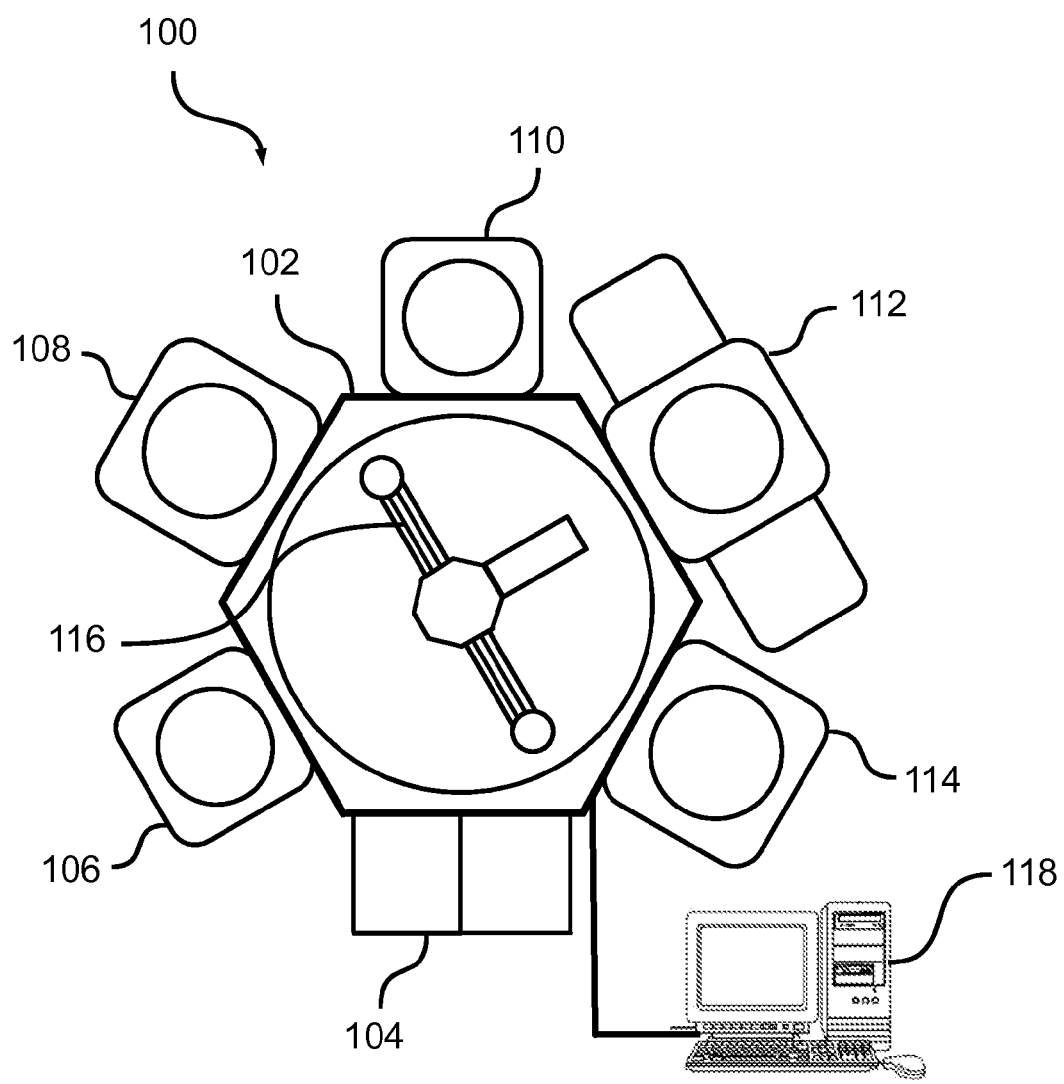
FIG. 1 is a plan schematic view of a substrate processing system according to some embodiments.

FIG. 1 illustrates a semiconductor processing system (or cluster tool) 100 according to some embodiments. The system 100 includes a frame 102, a load lock/factory interface 104, and a plurality of processing modules (or chambers) 106-114. In some embodiments, the frame 102 is configured such that that atmosphere/environment therein is controlled (e.g., vacuum/hermetically sealed). As used herein, the phrase "controlled atmosphere" and "controlled environment" will be understood to be equivalent and will be understood to include one of a vacuum, or an inert gas. Examples of inert gases include helium, neon, argon, krypton, xenon, and nitrogen. The load lock/factory interface 104 provides access (for semiconductor substrates) into the frame 102, which in turn provides access to the processing modules 106-114. As shown, the frame 102 also includes a transport system (e.g., a robot) 116 which is configured to move (or transport) the substrates between the load lock/factory interface 104 and the processing modules 106-114 through the frame 102 (i.e., the controlled atmosphere within the frame). As such, in at least some embodiments, the robot 116 may transport the substrates between the processing modules 106-114 without exposing the substrates to the atmosphere outside of the frame 102 (e.g., air).

As will be appreciated by one skilled in the art, the processing modules 106-114 may include processing modules suitable for performing various processes on the substrates, such as wet cleans, surface (e.g., plasma) treatments, and deposition processes, such as physical vapor deposition (PVD), chemical vapor deposition (CVD), and atomic layer deposition (ALD). In some embodiments, the processing modules 106-114 include a surface treatment module and at least one deposition module, such at an ALD module.

Still referring to FIG. 1, the processing system 100 also includes a controller (or control system) 118, which includes, for example, a processor and a memory. The controller 118 is in operable communication with the other components of the processing system and is configured to control the operation of the entire system 100 to perform the methods and processes described herein. It should be understood that in some embodiments, the controller 118 controls the operation of the individual modules 106-114. However, in some embodiments, the modules 106-114 may include individual controllers (or control systems).

Figure 2:
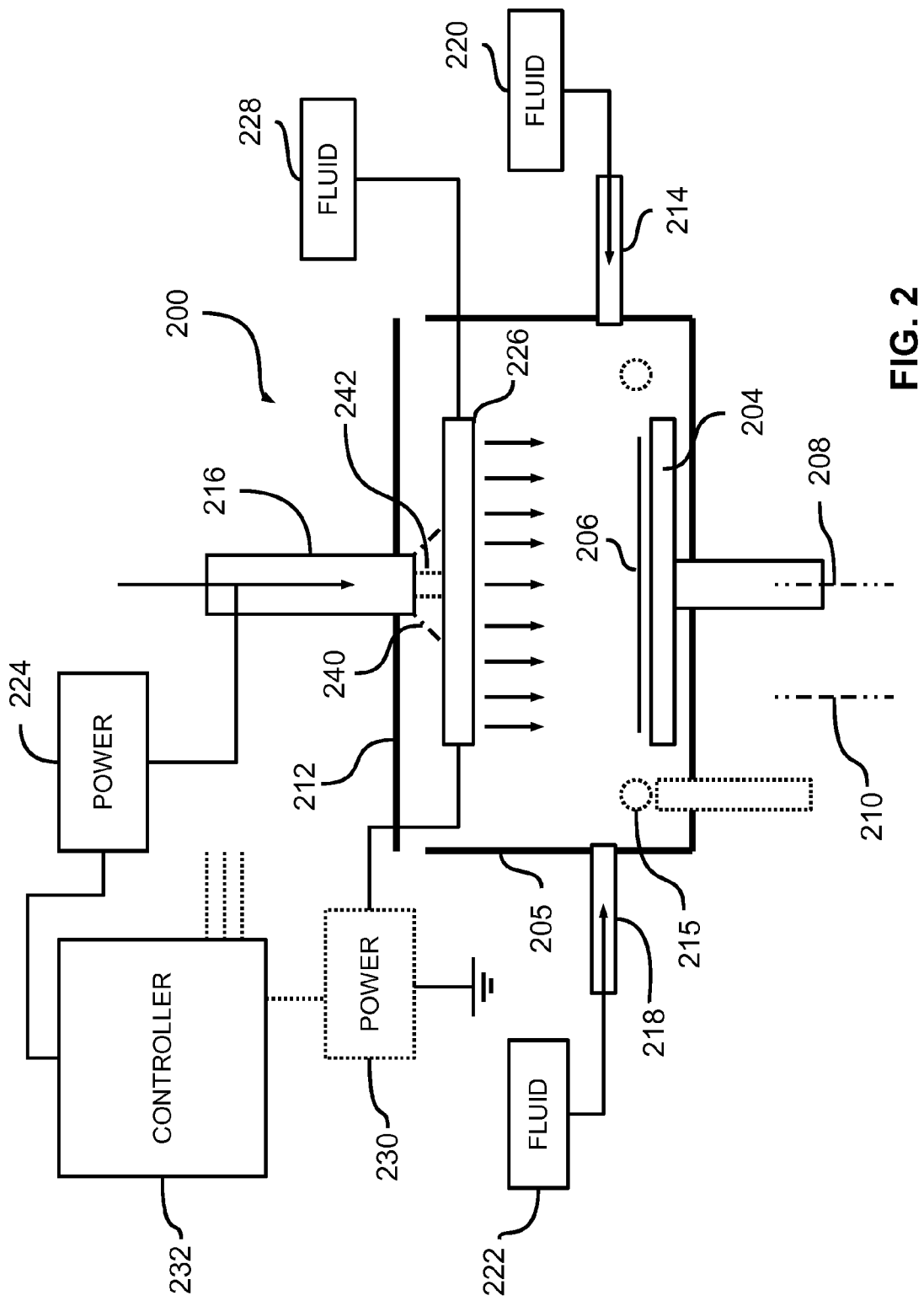
FIG. 2 is a cross-sectional schematic view of a surface treatment processing module according to some embodiments.

FIG. 2 illustrates a surface treatment (or plasma treatment) processing module (or chamber) 200 according to some embodiments. The surface treatment processing module 200 may be one of the processing modules 106-114 in the processing system shown in FIG. 1.

The processing module 200 includes a housing with a sidewall 205 and a lid 212, which define a processing chamber, and a substrate support 204 which is configured to hold a substrate 206 disposed thereon. The substrate support 204 may be any known substrate support, including but not limited to a vacuum chuck, electrostatic chuck or other known mechanisms. The substrate support 204 is capable of both rotating around its own central axis 208 (referred to as "rotation" axis, which is congruent with a central axis of the substrate 206), and rotating around a second axis 210 (referred to as "revolution" axis). Other substrate supports, such as an XY table, can also be used for site-isolated processing. In addition, the substrate support 204 may move in a vertical direction, i.e., away from or towards lid 212. It should be appreciated that the rotation and movement in the vertical direction may be achieved through known drive mechanisms which include magnetic drives, linear drives, worm screws, lead screws, a differentially pumped rotary feed through drive, etc. A power source 224 provides power to plasma generation source 216. It should be appreciated that power source 224 may output a direct current (DC) power supply, a pulsed DC power supply, or a radio frequency (RF) power supply.

The substrate 206 may be a conventional round 200 mm, 300 mm substrate, or any other larger or smaller substrate/wafer size. In some embodiments, the substrate 206 may be a square, rectangular, or other shaped substrate. One skilled in the art will appreciate that the substrate 206 may be a blanket substrate, a coupon (e.g., partial wafer), or even a patterned substrate having predefined regions.

Still referring to FIG. 2, the plasma generation source (or system) 216 extends through the lid 212. Fluid inlets 214 and 218 extend into the processing chamber through sidewalls (or a base). Fluid inlet 214 is in fluid communication with a fluid source 220, while fluid inlet 218 is in fluid communication with a fluid source 222. In some embodiments, fluid inlets 214 and 218 may be in fluid communication with the same fluid source. It should be appreciated that fluid inlets 214 and 218 may extend around a surface of the substrate 206 so that a perimeter of substrate 206. In some embodiments, fluid inlets 214 and 218 are configured as ring portions surrounding substrate 206.

In some embodiments, fluid inlets 214 and 218 are movable to vertically translate along with the substrate support 204 so that each fluid inlet remains proximate to an edge of substrate 206. For example, the ring portions may be coupled to an appropriate drive such as a worm gear, linear drive, etc., so that the fluid inlets 214 and 218 track the movement of the substrate and substrate support. The plasma generation source 216 is operable to provide a plasma activated species proximate to a surface of substrate 206. The plasma activated species provided by plasma generation source 216 has a non-reactive outer portion 240 surrounding a reactive inner portion 242 in accordance with some embodiments. It should be further appreciated that plasma generation source 216 may be a commercially available inductively coupled radio frequency (RF) plasma generation source.

It should also be appreciated that a plasma activated species may refer to the reactive atomic and molecular radicals converted from the precursor gas through interaction with the plasma. Further, the plasma may consist of non-charged species (e.g., radicals) and charged species (e.g., ions and electrons). Additionally, the plasma generation source (or system) 216 may include means for generating multiple types of plasma simultaneously.

In some embodiments, a plasma provided through the plasma generation source 216 includes a hydrogen, bromine, nitrogen, argon, oxygen, ammonia, nitrogen trifluoride, helium, or a combination thereof, based plasma referred to as a first precursor. The film feedstock provided by fluid inlets 214 and 218 may be any suitable feedstock for the desired deposition layer and may be referred to as a second precursor. Thus, for some embodiments described herein, the first precursor carries the plasma activated species and activates the second precursor proximate to the substrate surface at a specific site or region. However, as described below, in some embodiments, only one precursor (i.e., the first) is utilized, and a second precursor is not introduced.

Still referring to FIG. 2, the chamber 200 also includes a showerhead 226 suspended between the plasma generation source 216 and the substrate 206. Although not shown, the showerhead 226 may be vertically translatable (i.e., movable) within the processing chamber. An additional fluid source 228 is provided and coupled to (i.e., in fluid communication with) the showerhead 226. As described below, fluid source 228 may provide, for example, an inert gas to the showerhead during processing. Additionally, in some embodiments, the showerhead 226 is grounded as shown in FIG. 2. However, in other embodiments, a power supply (and controller) 230 may also be provided to control and modulate the charge on the showerhead 226.

The processing module 200 also includes a controller (or control sub-system) 232 which is in operable communication with the other components of the module 200, such as fluid sources 220, 222, and 228, power supply 224, etc. (not all connections are shown for clarity). The controller 232 includes, for example, a processor and memory, such as random access memory (RAM) and a hard disk drive. The controller 232 is configured to control the operation of the module 200 to perform the methods and processes described herein.

In some embodiments, the module 200 is used to perform "surface treatment" processing on the substrate 206. An example of such a treatment is exposing the substrate 206, or site-isolated regions on the substrate 206, to a plasma substantially including only radical species, or in some embodiments, only including radical species.

For example, is some embodiments, a plasma (e.g., bromine plasma and/or hydrogen plasma) is generated by the plasma generation source 216. The plasma is discharged into the processing chamber and through the showerhead 226. In some embodiments, at least some, if not all, of the charged species (e.g., ions and electrons) of the plasma are collected in or by the showerhead 226 such that only (or substantially only) the radical species of the plasma is allowed to flow from injection ports in the showerhead 226 and onto the substrate 206. It should be noted that in such a treatment only one precursor (i.e., the plasma) is used, as a second precursor is not introduced.

The collecting of the charged species by the showerhead 226 may be facilitated by electrically grounding the showerhead 226, which may cause virtually all of the charged species to be collected. However, in other embodiments, the charge on the showerhead 226 may be modulated by power supply 230, which may allow some of the charged species to pass through the showerhead 226 and onto the substrate 206. Additionally, in order to extend the "lifetime" of the radical species, an inert gas, such as argon or krypton, may be introduced into the showerhead 226 by fluid source 228 to reduce collisions with the charged species and allow for a greater number of radical species to be flowed onto the substrate 206.

In some embodiments, this process may be sequentially repeated using different types of plasma. For example, after the treatment described above using hydrogen plasma and/or bromine plasma (and thus hydrogen and/or bromine radicals), a similar process may be carried out using oxygen plasma (and thus oxygen radicals). In some embodiments, the duration of each of these treatments may be, for example, between about 1.0 second and 5.0 seconds, and the time between the cessation of one treatment and the beginning of the next may be, for example, less than 1 second. The surface treatment techniques described above may be used to facilitate the formation of a subsequently formed layer on the substrate 206, such as by ALD.

Figure 3:
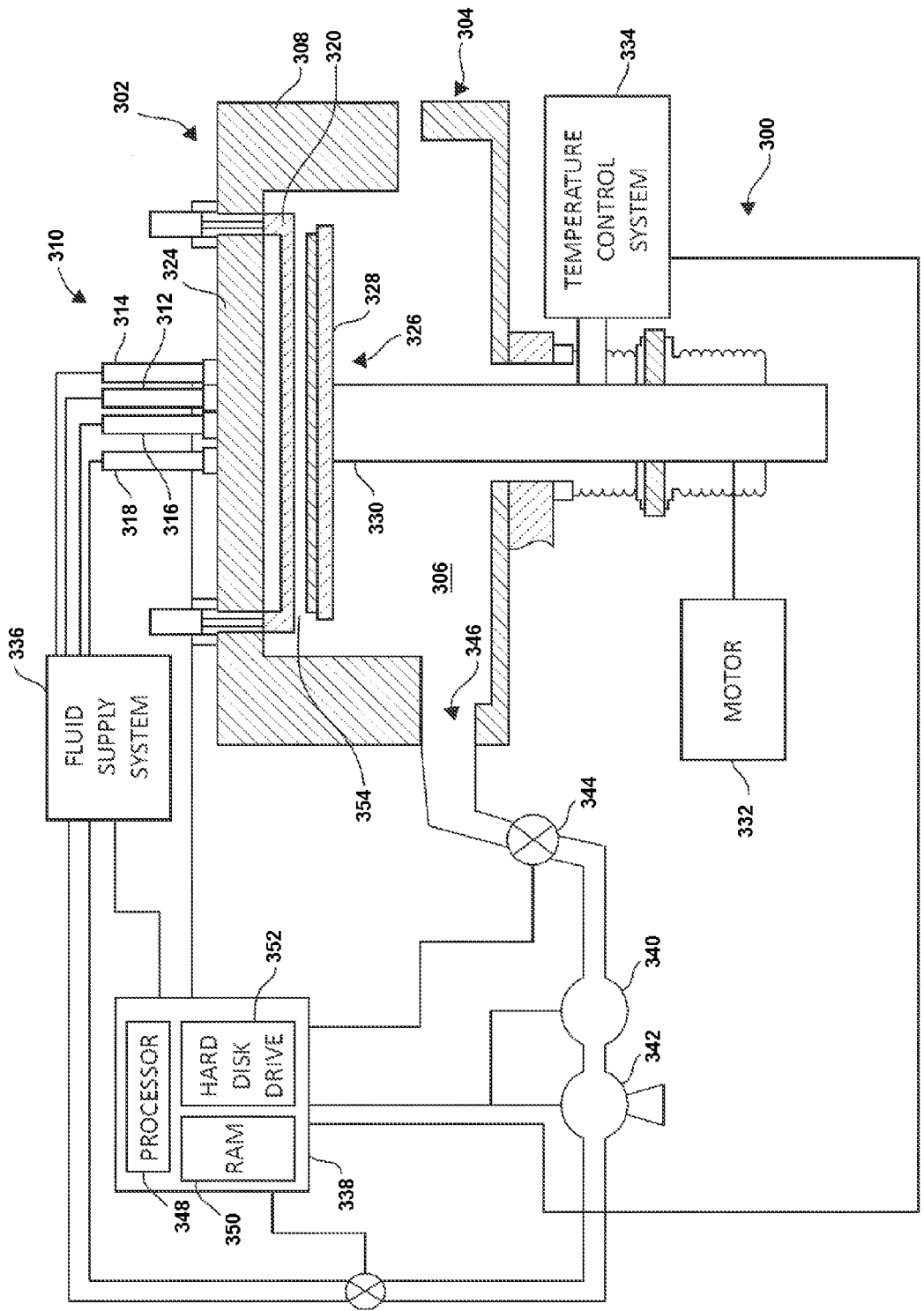
FIG. 3 is a cross-sectional schematic view of a chemical vapor deposition (CVD) processing module according to some embodiments.

FIG. 3 illustrates a processing module (e.g., an ALD processing module) 300 according to some embodiments. The processing module 300 may be one of the processing modules 106-114 in the processing system shown in FIG. 1.

The module (or chamber) 300 includes an enclosure assembly 302 formed from a process-compatible material, such as aluminum or anodized aluminum. The enclosure assembly 302 includes a housing 304, which defines a processing chamber 306, and a vacuum lid assembly 308 covering an opening to the processing chamber 306 at an upper end thereof. Although only shown in cross-section, it should be understood that the processing chamber 306 is enclosed on all sides by the housing 304 and/or the vacuum lid assembly 308.

A process fluid injection assembly 310 is mounted to the vacuum lid assembly 308 and includes a plurality of passageways (or injection ports) 312, 314, 316, and 318 and a showerhead 320 to deliver reactive and carrier fluids into the processing chamber 306. In the embodiment depicted in FIG. 3, the showerhead 320 is moveably coupled to an upper portion of the vacuum lid assembly 308 (i.e., a backing plate 324). The showerhead 320 may be formed from any known material suitable for the application, including stainless steel, aluminum, anodized aluminum, nickel, ceramics and the like.

Referring again to FIG. 3, the module 300 also includes a heater/lift assembly 326 disposed within processing chamber 306. The heater/lift assembly 326 includes a support pedestal (or substrate support) 328 connected to an upper portion of a support shaft 330. The support pedestal 328 is positioned between shaft 330 and the backing plate 324 and may be formed from any process-compatible material, including aluminum nitride and aluminum oxide. The support pedestal 328 is configured to hold or support a substrate and may be a vacuum chuck, as is commonly understood, or utilize other conventional techniques, such as an electrostatic chuck (ESC) or physical clamping mechanisms, to prevent the substrate from moving on the support pedestal 328. The support shaft 330 is moveably coupled to the housing 304 so as to vary the distance between support pedestal 328 and the backing plate 324. That is, the support shaft 330 may be vertically moved to vary the distance between the support pedestal 328 and the backing plate 324. In the depicted embodiment, a lower portion of the support shaft 330 is coupled to a motor 332 which is configured to perform this movement. Although not shown, a sensor may provide information concerning the position of the support pedestal 328 within processing chamber 306.

The support pedestal 328 may be used to heat the substrate through the use of heating elements (not shown) such as resistive heating elements embedded in the pedestal assembly. In the embodiment shown in FIG. 3, a temperature control system 334 is provided to control the heating elements, as well as maintain the chamber housing 304, vacuum lid assembly 308, and showerhead 320 within desired temperature ranges in a conventional manner.

Still referring to FIG. 3, the module 300 also includes a fluid supply system 336 and a controller (or system control system) 338. The fluid supply system 336 is in fluid communication with the passageways 312, 314, 316, and 318 through a sequence of conduits (or fluid lines).

The fluid supply system 336 (and/or the controller 338) controls the flow of processing fluids to, from, and within the processing chamber 306 are with a pressure control system that includes, in the embodiment shown, a turbo pump 340 and a roughing pump 342. The turbo pump 340 and the roughing pump 342 are in fluid communication with processing chamber 306 via a butterfly valve 344 and a pump channel 346.

The controller 338 includes a processor 348 and memory, such as random access memory (RAM) 350 and a hard disk drive 352. The controller 338 is in operable communication with the various other components of the processing module 300, including the turbo pump 340, the temperature control system 334, the fluid supply system 336, and the motor 332 and controls the operation of the entire processing module to perform the methods and processes described herein.

During operation, the module 300 establishes conditions in a processing region 354 between an upper surface of the substrate and the showerhead 320, such as injecting precursors (or reagents), as well as purge gases, to form the desired material on the surface of the substrate.

Figure 4:
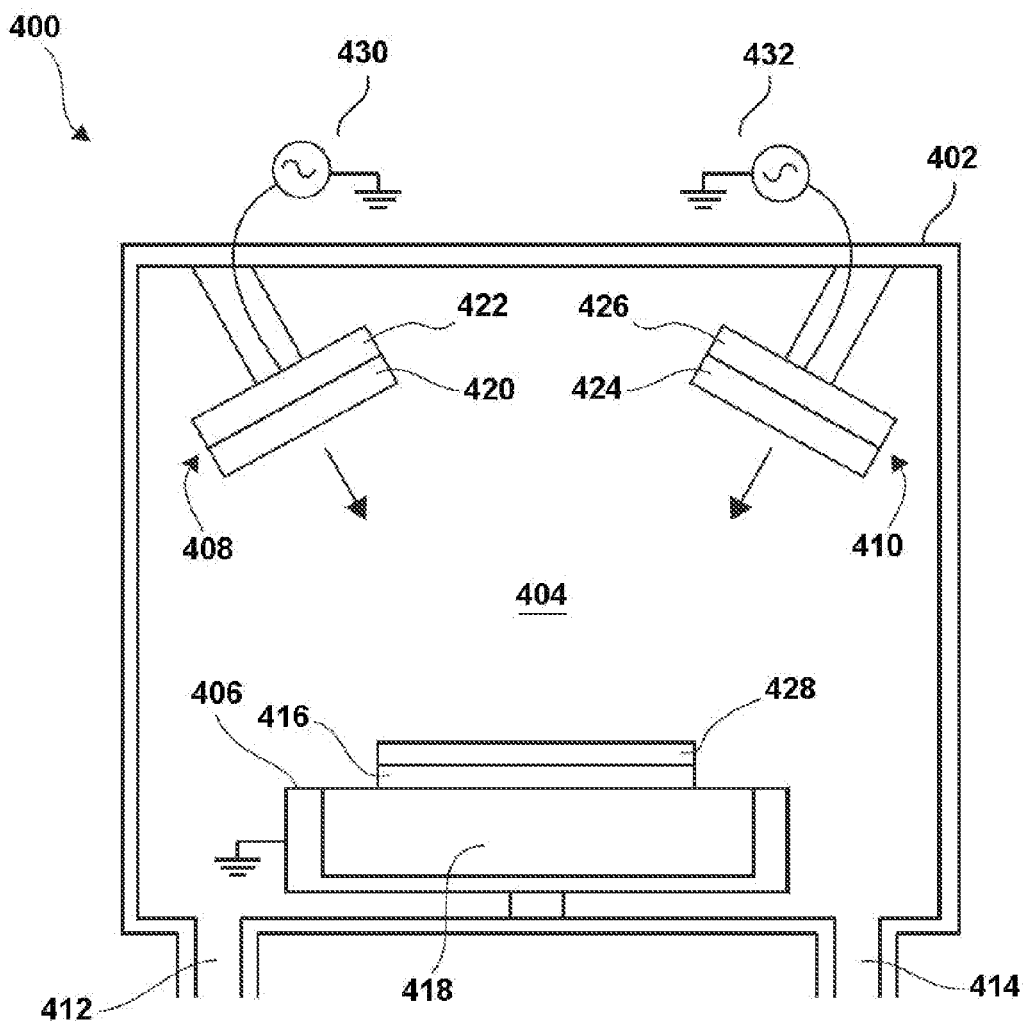
FIG. 4 is a cross-sectional schematic view of a physical vapor deposition (PVD) processing module according to some embodiments.

FIG. 4 illustrates a PVD processing module 400 according to some embodiments. The PVD processing module 400 may be one of the processing modules 106-114 in the processing system shown in FIG. 1.

The PVD module 400 shown in FIG. 4 includes a housing 402 that defines, or encloses, a processing chamber 404, a substrate support 406, a first target assembly 408, and a second target assembly 410.

The housing 402 includes a gas inlet 412 and a gas outlet 414 near a lower region thereof on opposing sides of the substrate support 406. The substrate support 406 is positioned near the lower region of the housing 402 and in configured to support a substrate 416. The substrate 416 may be a round glass (e.g., borosilicate glass) substrate having a diameter of, for example, about 200 mm or about 300 mm. In other embodiments (such as in a manufacturing environment), the substrate 416 may have other shapes, such as square or rectangular, and may be significantly larger (e.g., about 0.5-about 6 m across). The substrate support 406 includes a support electrode 418 and is held at ground potential during processing, as indicated.

The first and second target assemblies (or process heads) 408 and 410 are suspended from an upper region of the housing 402 within the processing chamber 404. The first target assembly 408 includes a first target 420 and a first target electrode 422, and the second target assembly 410 includes a second target 424 and a second target electrode 426. As shown, the first target 420 and the second target 424 are oriented or directed towards the substrate 416. As is commonly understood, the first target 420 and the second target 424 include one or more materials that are to be used to deposit a layer of material 428 on the upper surface of the substrate 416.

The materials used in the targets 420 and 424 may, for example, include tin, zinc, tin, magnesium, aluminum, lanthanum, yttrium, titanium, antimony, strontium, bismuth, silicon, silver, nickel, chromium, niobium, or any combination thereof (i.e., a single target may be made of an alloy of several metals). Additionally, the materials used in the targets may include oxygen, nitrogen, or a combination of oxygen and nitrogen in order to form oxides, nitrides, and oxynitrides. Additionally, although only two targets 420 and 424 are shown, additional targets may be used.

The PVD tool 400 also includes a first power supply 430 coupled to the first target electrode 422 and a second power supply 432 coupled to the second target electrode 424. As is commonly understood, the power supplies 430 and 432 pulse direct current (DC) power to the respective electrodes, causing material to be, at least in some embodiments, simultaneously sputtered (i.e., co-sputtered) from the first and second targets 420 and 424.

During sputtering, inert gases, such as argon or krypton, may be introduced into the processing chamber 304 through the gas inlet 412, while a vacuum is applied to the gas outlet 414. However, in embodiments in which reactive sputtering is used, reactive gases may also be introduced, such as oxygen and/or nitrogen, which interact with particles ejected from the targets (i.e., to form oxides, nitrides, and/or oxynitrides).

Although not shown in FIG. 4, the PVD tool 400 may also include a control system having, for example, a processor and a memory, which is in operable communication with the other components shown in FIG. 4 and configured to control the operation thereof in order to perform the methods described herein.

Further, although the PVD tool 400 shown in FIG. 4 includes a stationary substrate support 406, it should be understood that in a manufacturing environment, the substrate 416 may be in motion (e.g. an inline configuration) during the various layers described herein.

FIGS. 5-11 illustrate a method for forming a semiconductor device according to some embodiments. The processing steps described below (or at least some of the processing steps described below) may be performed in the substrate processing system 100 (i.e., the various processing modules 106-114) shown in FIG. 1 and described above.

Figure 5:
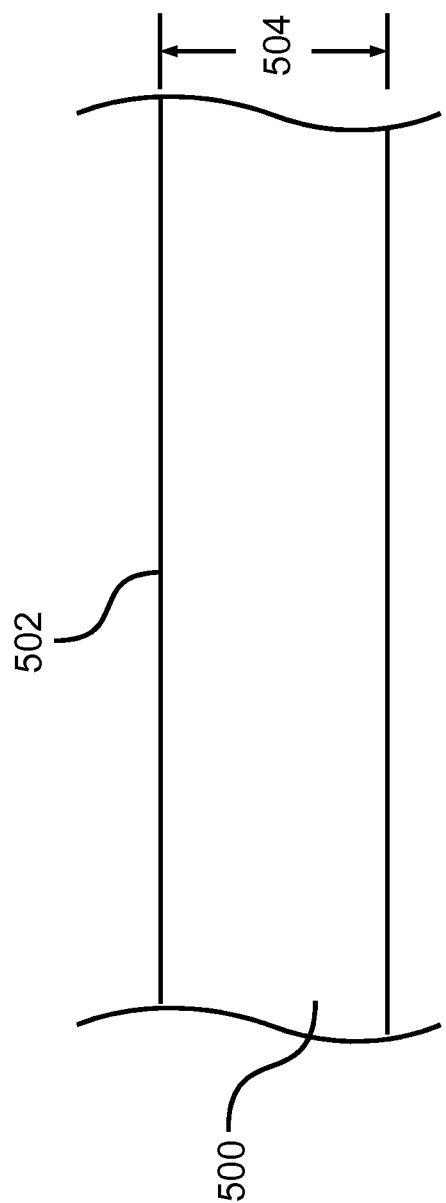
FIG. 5 is a cross-sectional view of a substrate according to some embodiments.

Referring to FIG. 5, a substrate 100 is provided. In some embodiments, the substrate 100 includes (or is made of) a semiconductor material. In some embodiments, the substrate 500 includes a "III-V" semiconductor material, such as gallium arsenide. In other embodiments, the substrate 500 includes silicon and/or germanium. The substrate 500 has an upper surface 502 and a thickness 504 of, for example, between about 200 and 400 micrometers ($\mu$m).

Figure 6:
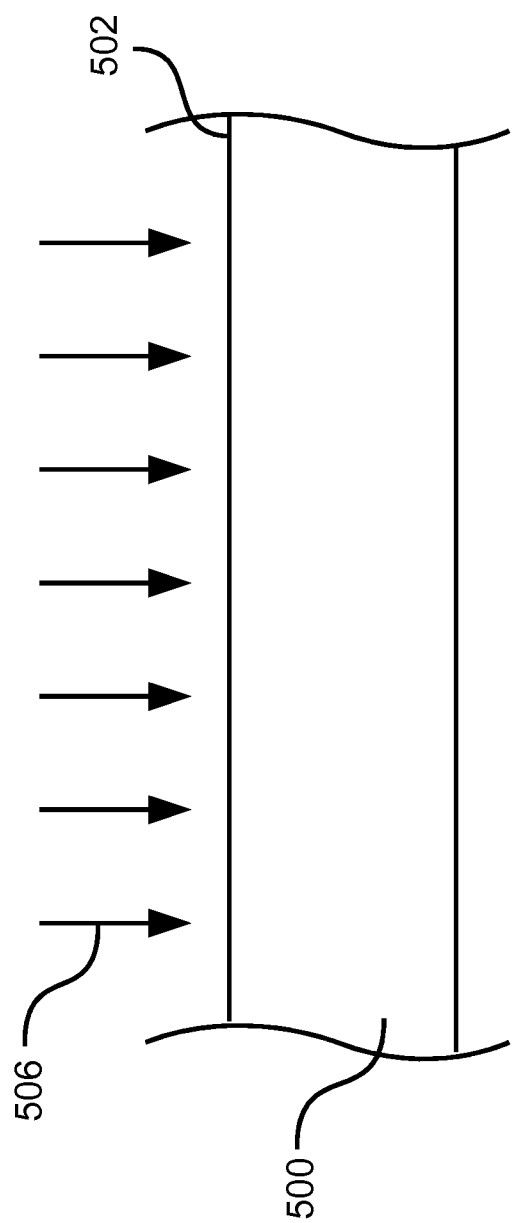
FIG. 6 is a cross-sectional view of the substrate of FIG. 5 undergoing a surface treatment process.

Referring to FIG. 6, the upper surface 502 of the substrate 500 is first exposed to one or more radical species 506, which may be performed in the surface treatment processing module 200 shown in FIG. 2 (i.e., one of the processing modules 106-114 in FIG. 1). Referring again to FIG. 6, the radicals species 506 includes bromine radicals, hydrogen radicals, or a combination thereof and may remove any native oxide and hydrocarbons which have present on the upper surface 502 of the substrate 500. Although not shown, after the exposure to the radical species 506, the surface 502 of the substrate 500 may be substantially terminated by hydrogen atoms.

The substrate 500 is then transferred from the surface treatment processing module 200 of FIG. 2 to the ALD processing module 300 of FIG. 3. Referring again to FIG. 1, this transfer may performed by passing the substrate 500 through the frame 102 such that the substrate 500 remains in a controlled-atmosphere environment (i.e., the substrate 500 is not exposed to the atmosphere during the transfer from the surface treatment processing module 200 to the ALD processing module 300). That is, the substrate 500 is held within a controlled-atmosphere at least from the completion of the surface treatment process to the beginning of the next processing step (e.g., the formation of an oxide layer).

Figure 7:
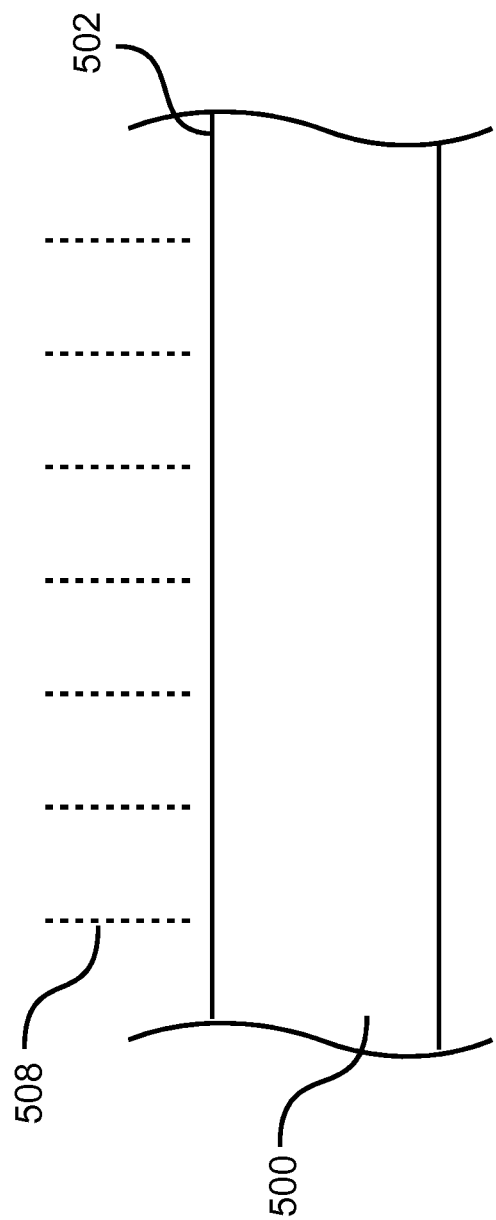
FIG. 7 is a cross-sectional view of the substrate of FIG. 6 being exposed to a reagent.

Referring to FIG. 7, within the ALD processing module 300 (FIG. 3), the upper surface 502 of the substrate 500 is exposed to various reagents 508. In some embodiments, the surface 502 of the substrate is first (after being transferred to the ALD processing module 300) exposed to an oxidant, such as water vapor, hydrogen peroxide gas, or ozone. As will be appreciated by one skilled in the art, the exposure to the oxidant may include exposing the substrate 500 to one or more "pulses" (e.g., a short exposure with a duration of, for example, 0.5-1.0 seconds). The exposure to the oxidant may cause the surface 502 of the substrate 500 to be terminated by oxygen/hydrogen bonds (i.e., a O—H terminated surface). Still referring to FIG. 7, the surface 502 of the substrate 500 is then exposed to a metal precursor. In some embodiments, the metal precursor is an aluminum-containing precursor, such as trimethylaluminum (TMA).

Figure 8:
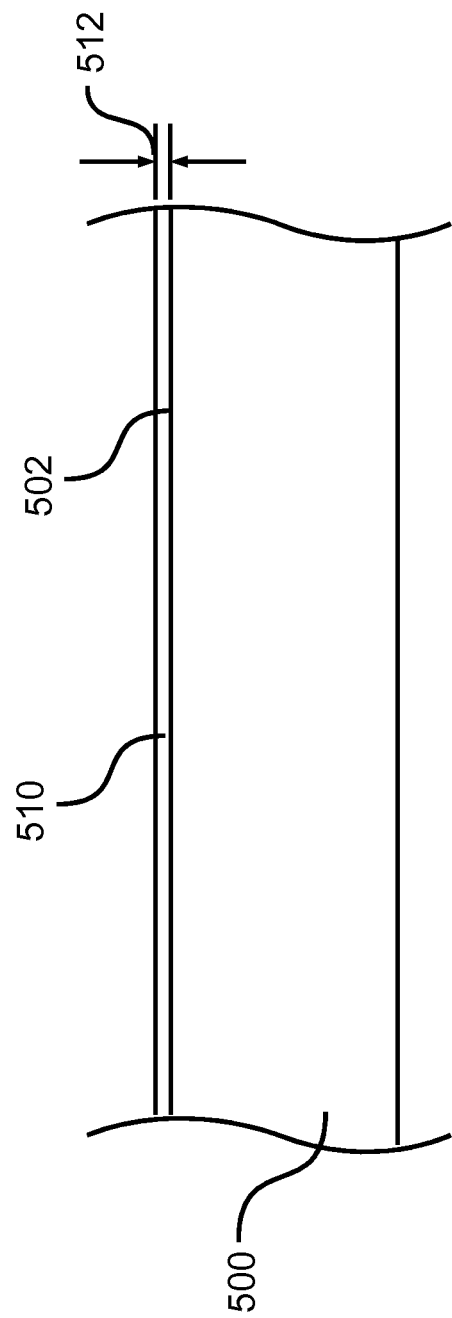
FIG. 8 is a cross-sectional view of the substrate of FIG. 7 after a first oxide layer has been formed above an upper surface thereof.

The exposure to the oxidant and the metal precursor are repeated in an alternating manner (perhaps in combination with purges performed after each such exposure) such that a (first) metal oxide layer 510 is formed above the upper surface 502 of the substrate 500, as shown in FIG. 8. In some embodiments, the metal oxide layer 510 is made of aluminum oxide and has a thickness 512 of, for example, between about 0.5 nanometers (nm) and about 1.0 nm.

Figure 9:
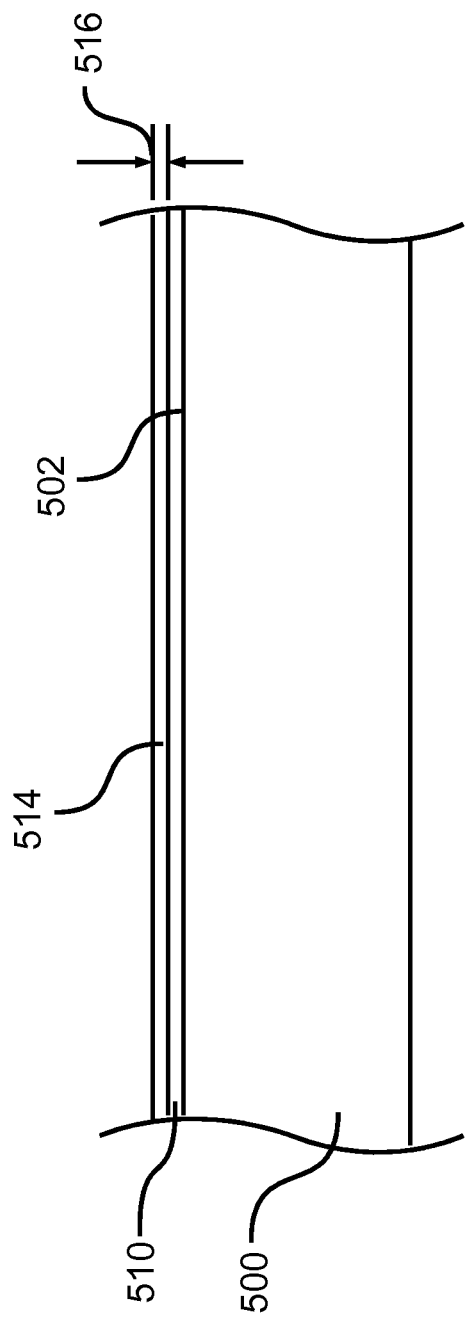
FIG. 9 is a cross-sectional view of the substrate of FIG. 8 after a second oxide layer has been formed above the oxide layer.

Referring to FIG. 9, a (second) metal oxide layer 514 is then formed above the first metal oxide layer 510. In some embodiments, the second metal oxide layer 514 is made of high-k dielectric material (e.g., hafnium oxide) and has a thickness 516 of, for example, between about 1.0 nm and about 2.0 nm. The formation of the second metal oxide layer 514 may be performed in the ALD processing module 300 using a process similar to that described above (i.e., alternating pulses of a precursor and an oxidant), using, for example, hafnium tetrachloride as the precursor and water vapor or trioxygen (i.e., ozone) as the oxidant.

Figure 10:
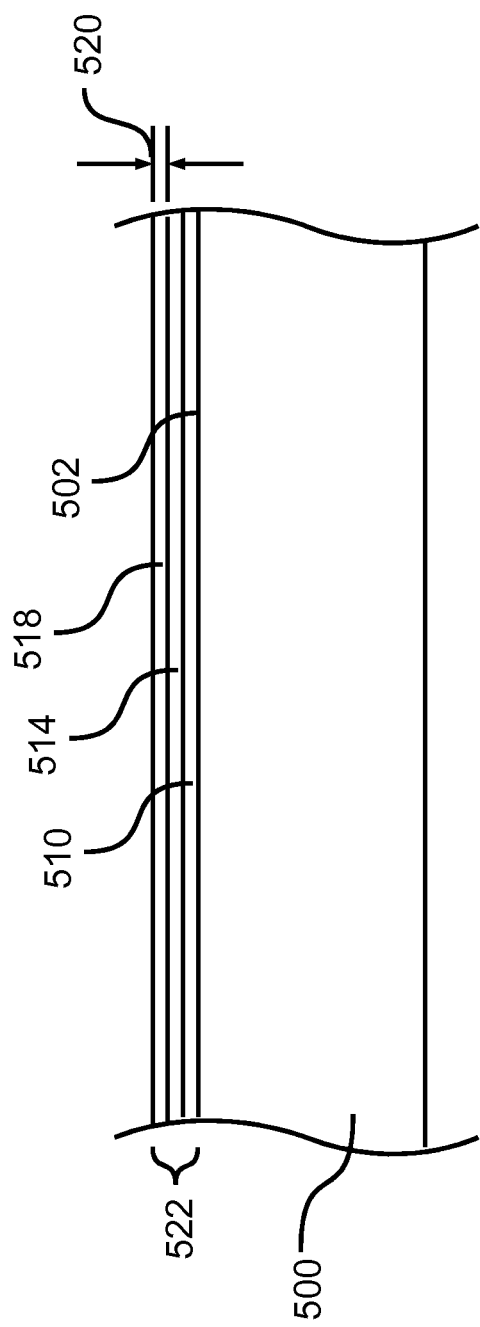
FIG. 10 is a cross-sectional view of the substrate of FIG. 8 after a metallic layer has been formed above the second oxide layer.
Figure 11:
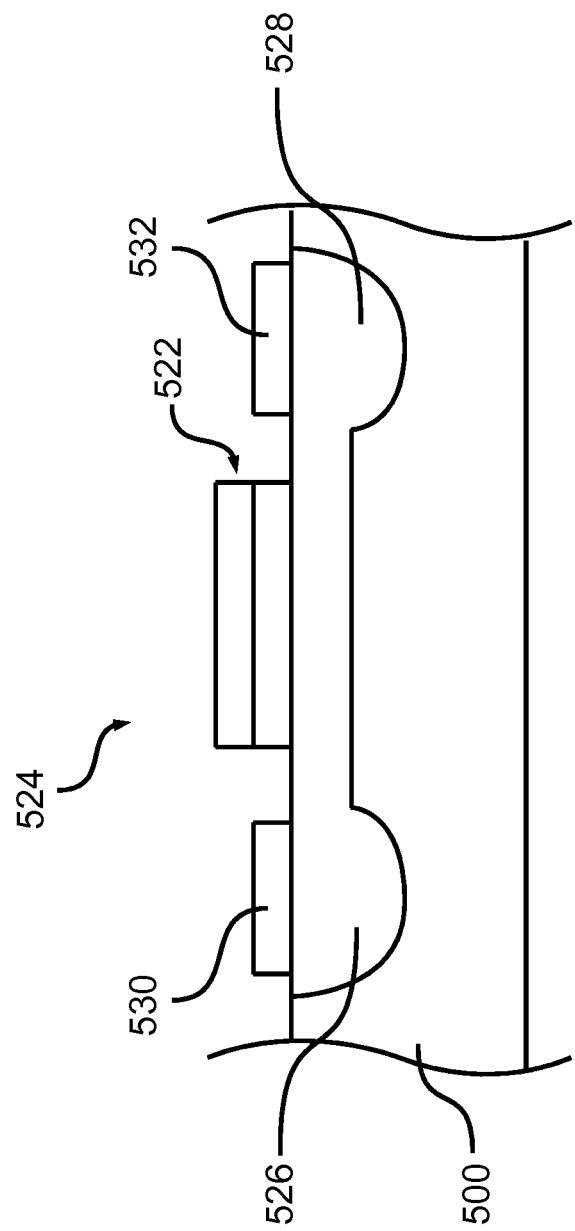
FIG. 11 is a cross-sectional view of the substrate of FIG. 8 after a semiconductor device has been formed above the upper surface thereof.

Referring now to FIG. 10, a metallic layer 516 is then formed above the second metal oxide layer 514. In some embodiments, the metallic layer 518 is made of titanium nitride and has a thickness 520 of, for example, between about 1.0 nm and about 2.0 nm.

The first metal oxide layer 510, the second metal oxide layer 512, and the metallic layer 516 may jointly form a gate stack 522, with the first and second metal oxide layers 510 and 512 forming a gate dielectric and the metallic layer 516 forming a gate (or gate electrode). In some embodiments, the gate stack 522 may be incorporated into a semiconductor device, such as the field-effect transistor 524 shown in FIG. 11, in which the gate stack 524 forms a gate dielectric and a gate electrode. The transistor 524 also includes a source region 526 and a drain region 528 formed in the substrate 500 via, for example, implanting (or doping) N-type impurities into the substrate 500, which have diffused to the region below the gate stack 522. The transistor 524 also includes a source ohmic contact 530 formed above the source region 526 and a drain ohmic contact 532 formed above the drain region 528.

Because the surface treatment (i.e., exposure to the hydrogen and/or bromine radicals) is performed before the formation of the gate stack, as well as the fact that the substrate is transferred from the surface treatment processing module to the ALD processing module without being exposed to the atmosphere, no native oxide is present on the surface of the substrate when the gate stack is formed. As a result, the interface trap density (Dit) of the gate stack is reduced (e.g., $1 \times 10^{11}$ cm$^2$/eV or less) when compared to conventional processing sequences. Additionally, because the surface of the substrate is terminated with O—H bonds when the formation of the gate stack begins, the nucleation of the first metal oxide layer (e.g., aluminum oxide) is improved.

FIGS. 12-16 illustrate a method for forming a semiconductor device according to some embodiments. The processing steps described below (or at least some of the processing steps described below) may be performed in the substrate processing system 100 (i.e., the various processing modules 106-114) shown in FIG. 1 and described above.

Figure 12:
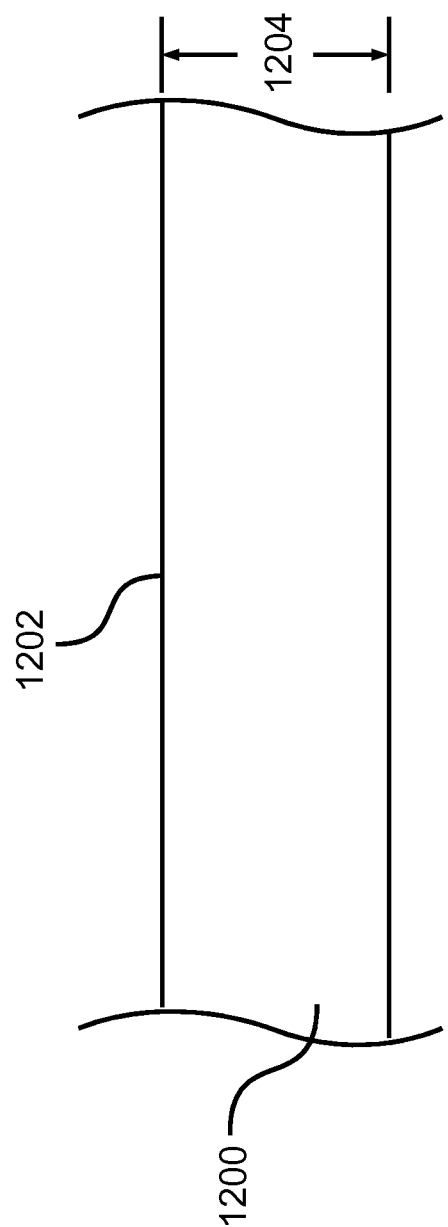
FIG. 12 is a cross-sectional view of a substrate according to some embodiments.

Referring to FIG. 12, a substrate 1200 is provided. In some embodiments, the substrate 1200 includes (or is made of) a semiconductor material. In some embodiments, the substrate 1200 includes silicon (e.g., N-type silicon). In other embodiments, the substrate 1200 includes germanium (e.g., N-type germanium), indium arsenide (e.g., N-type indium arsenide), indium gallium arsenide (e.g., N-type indium gallium arsenide), gallium arsenide (e.g., N-type gallium arsenide), and/or is a silicon-germanium compound substrate (e.g., N-type silicon-germanium compound). The substrate 1200 has an upper surface 1202 and a thickness 1204 of, for example, between about 200 and 400 micrometers (μm).

In some embodiments, the upper surface 1202 of the substrate 1200 first undergoes a wet clean process, as is commonly understood in the art. The wet clean may be performed in one of the processing module 106-114 in the system shown in FIG. 1. However, in some embodiments, the wet clean may be performed before the substrate 1200 is introduced into the processing system of FIG. 1.

Figure 13:
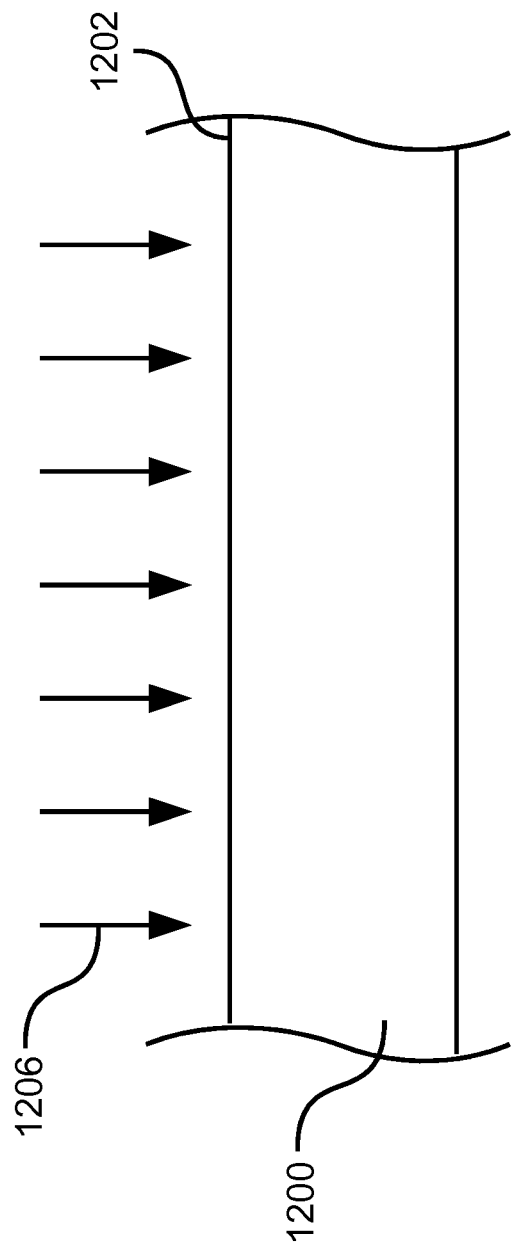
FIG. 13 is a cross-sectional view of the substrate of FIG. 12 undergoing a surface treatment process.

Referring to FIG. 13, the upper surface 1202 of the substrate 1200 is then exposed to one or more radical species 1206, which may be performed in the surface treatment processing module 200 shown in FIG. 2 (i.e., one of the processing modules 106-114 in FIG. 1). Referring again to FIG. 13, the radicals species 1206 includes bromine radicals, hydrogen radicals, or a combination thereof and may remove any native oxide and hydrocarbons which have formed on the upper surface 1202 of the substrate 1200. Although not shown, after the exposure to the radical species 1206, the surface 1202 of the substrate 1200 may be substantially terminated by hydrogen atoms.

In some embodiments, the substrate 1200 is then transferred from the surface treatment processing module 200 of FIG. 2 to the PVD processing module 400 of FIG. 4. Referring again to FIG. 1, this transfer may performed by passing the substrate 1200 through the frame 102 such that the substrate 1200 remains in a controlled-atmosphere environment (i.e., the substrate 1200 is not exposed to the atmosphere during the transfer from the surface treatment processing module 200 to the PVD processing module 400).

Figure 14:
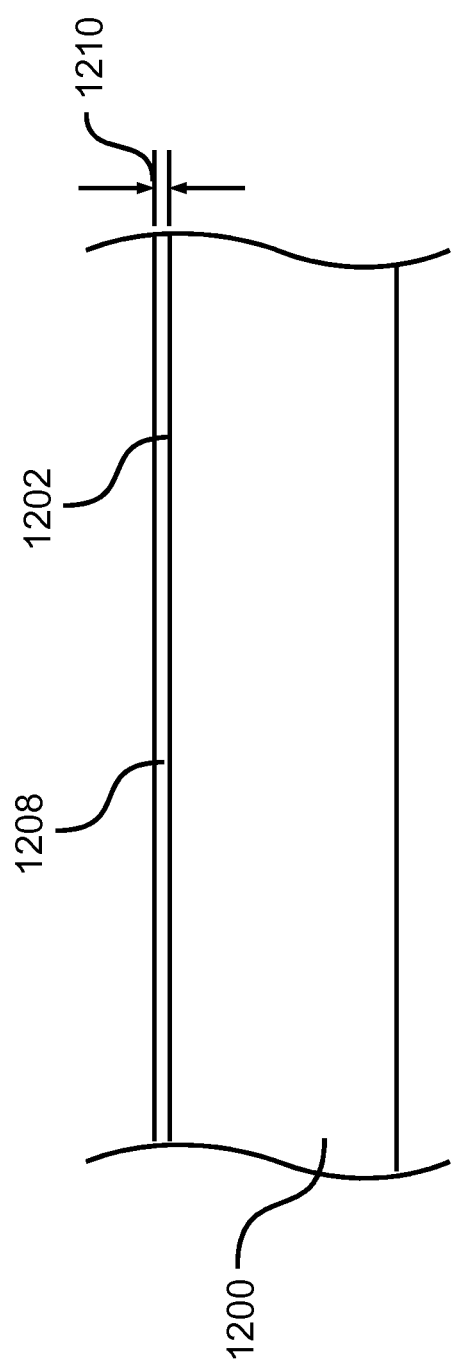
FIG. 14 is a cross-sectional view of the substrate of FIG. 13 after an oxide layer has been formed above an upper surface thereof.

Next, as shown in FIG. 14, an oxide layer 1208 is then formed above the upper surface 1202 of the substrate 1200 (e.g., via sputtering in the PVD processing module). The oxide layer 1208 may include zinc. In some embodiments, the oxide layer 1208 includes (or is made of) indium gallium zinc oxide, cadmium zinc oxide, germanium zinc oxide, or a combination thereof. The oxide layer 1208 may have a thickness 1210 of, for example, between about 2 nm and about 10 nm.

Figure 15:
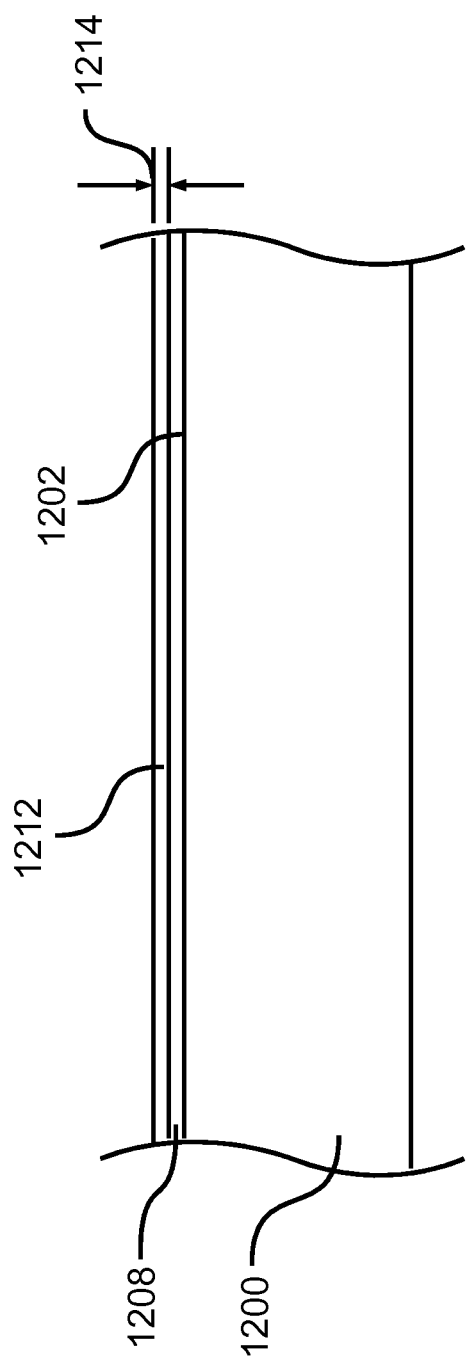
FIG. 15 is a cross-sectional view of the substrate of FIG. 14 after a metal layer has been formed above the oxide layer.

After the formation of the oxide layer 1208, the substrate 1200 may be transferred to another PVD processing module in the processing system 100 (FIG. 1) such that the substrate 1200 is not exposed to the atmosphere (e.g., through the frame 102). Referring now to FIG. 15, a metal layer 1212 is then formed above the oxide layer 1208 (e.g., via sputtering). The metal layer 1212 may include titanium. In some embodiments, the metal layer 1212 includes (or is made of) titanium sulfide, titanium selenide, or a combination thereof. The metal layer 1212 may have a thickness 1214 of, for example, between about 2 nm and about 10 nm. In some embodiments, the metal layer 1212 may be formed using ALD (e.g., in the ALD processing module 300 in FIG. 3, after transferring the substrate 1200 to the ALD processing module 300 without exposing the substrate 1200 to the atmosphere).

Figure 16:
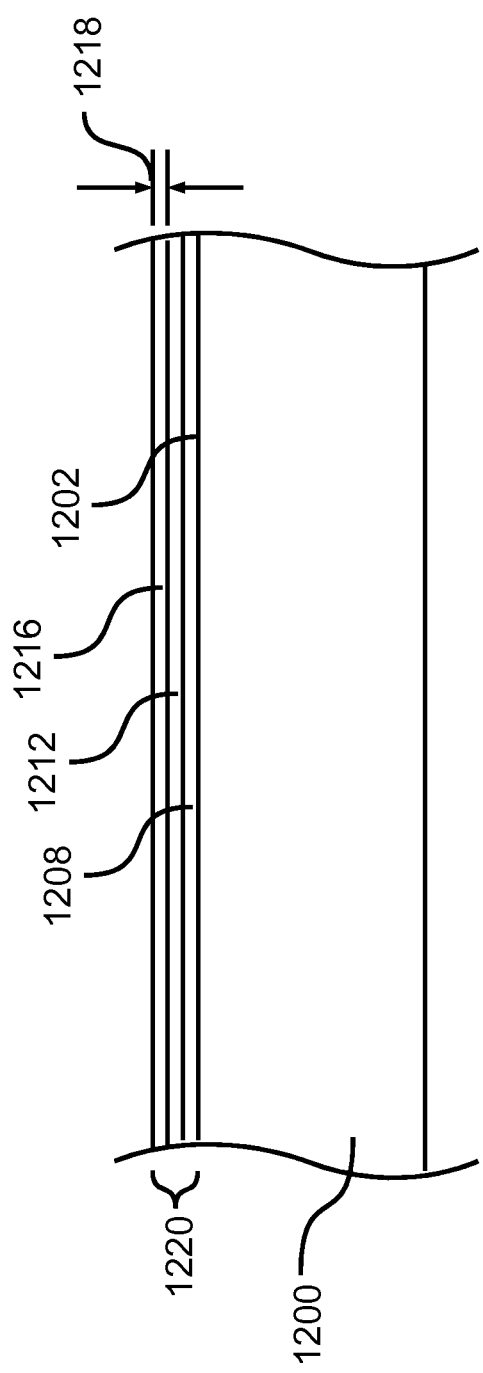
FIG. 16 is a cross-sectional view of the substrate of FIG. 15 after a barrier layer has been formed above the metal layer.
Figure 17:
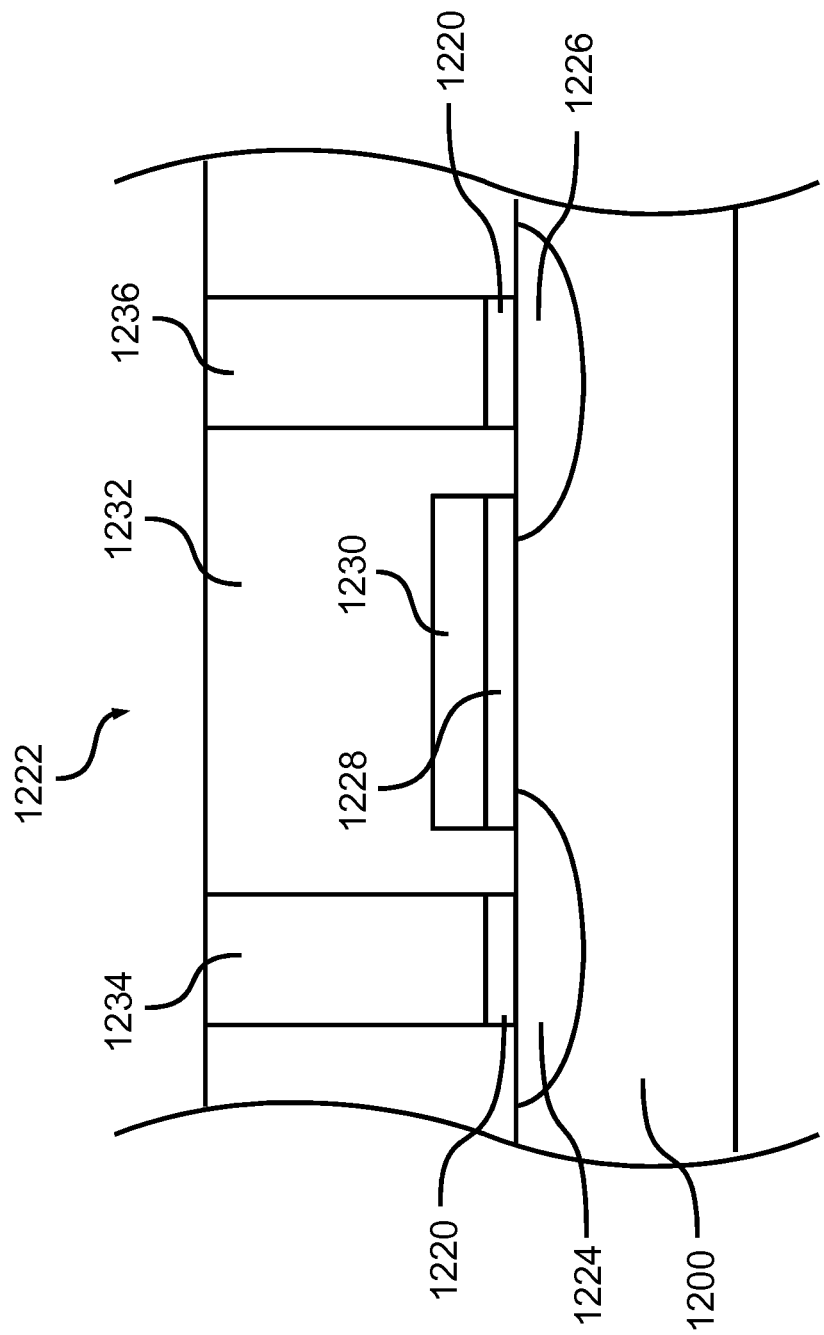
FIG. 17 is a cross-sectional view of the substrate of FIG. 15 after a semiconductor device has been formed above the upper surface thereof.

After the formation of the metal layer 1212, the substrate 1200 may be transferred to yet another PVD processing module in the processing system 100 (FIG. 1) such that the substrate 1200 is not exposed to the atmosphere (e.g., through the frame 102). Referring now to FIG. 16, a barrier layer 1216 is then formed above the metal layer 1212 (e.g., via sputtering). The barrier layer 1216 may include titanium nitride. The barrier layer 1216 may have a thickness 1218 of, for example, between about 2 nm and about 10 nm.

The oxide layer 1208, the metal layer 1212, and the barrier layer 1216 may jointly form a contact structure 1220. In some embodiments, the contact structure 1220 may be incorporated into a semiconductor device, such as the metal-oxide-semiconductor field-effect transistor (MOSFET) 1222 shown in FIG. 16, in which the contact structure 1220 is used to form an ohmic contact source region 1224 and an ohmic contact for drain region 1226. As is commonly understood, the source region 1224 and the drain region 1226 are formed by implanting impurities or doping the substrate 1200 (e.g., before the formation of the contact structure(s)). The MOSFET 1222 also includes a gate dielectric 1228 formed above the substrate 1200, at least partially overlapping the source region 1224 and the drain region 1226, and a gate electrode 1230 formed above the gate dielectric 1228. Additionally, the MOSFET 1222 includes a dielectric material 1232 formed above the source region 1224, the drain region 1226, and the gate electrode 1230, as well as conductive vias (or contacts) 1234 and 1236 (e.g., tungsten or copper) formed in via openings through the dielectric material 1232 above the ohmic contacts formed by the contact structure(s) 1220 (i.e., the contacts 1234 and 1236 are electrically connected to the source region 1224 and 1226, respectively).

Because the surface treatment (i.e., exposure to the hydrogen and/or bromine radicals) is performed before the formation of the contact structure, as well as the fact that the substrate is transferred from the surface treatment processing module to the PVD (or ALD) processing module without being exposed to the atmosphere, no native oxide is present on the surface of the substrate when the contact structure is formed. As a result, the contact resistance is reduced (e.g., $1\times10^{-10}$ nΩ-cm$^2$ or less) compared to conventional processing sequences (in which the native oxide is present on the substrate).

Additionally, because of the use of indium gallium zinc oxide, cadmium zinc oxide, and/or germanium zinc oxide in the oxide layer in the contact structure, the Fermi level at the metal/semiconductor interface is depinned. Also, a very low energy barrier is provided between the conduction band edge in semiconductor material and the conductive oxide conduction band edge, which allows for very high current flow between metal and semiconductor, and very low electron tunneling effective mass is provided in the conductive oxide which allows for very high current flow between metal and semiconductor (i.e. low specific contact resistivity).

Further, the use of titanium, titanium-sulfide, and/or titanium-selenide in the metal layer in the contact structure provides a very low barrier height between the metal and the semiconductor. As a result, high current to flow between the metal and the semiconductor is facilitated.

Figure 18:
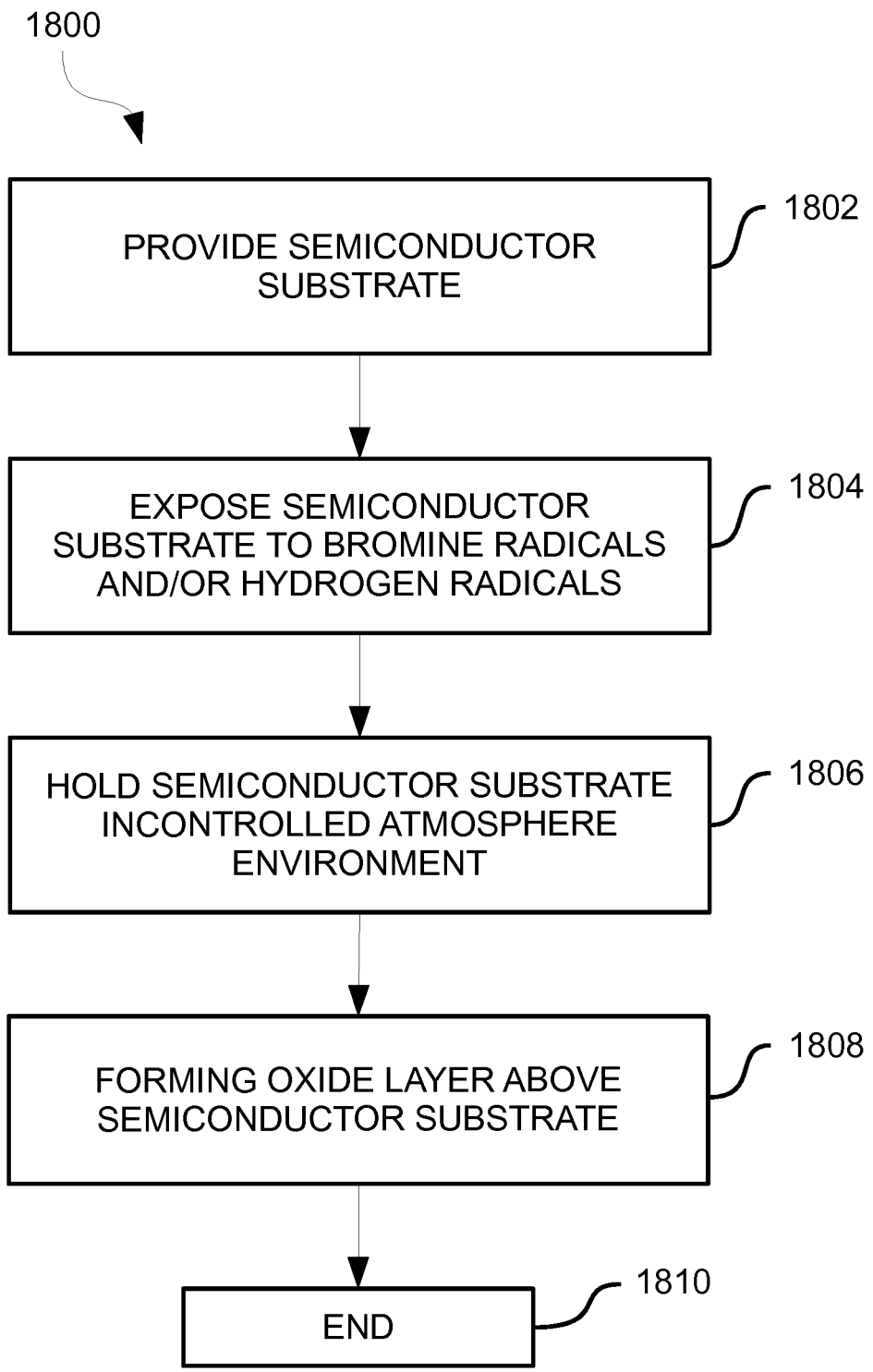
FIG. 18 is flow chart of a method for forming a semiconductor device according to some embodiments.

FIG. 18 illustrates a method 1800 for forming a semiconductor device according to some embodiments. At block 1802, the method 1800 begins by providing a substrate, such as the semiconductor substrates described above.

At block 1804, the semiconductor substrate is exposed to bromine radicals and/or hydrogen radicals. As described above, the exposure to the bromine and/or hydrogen radicals may remove any native oxide and/or hydrocarbons that are on the substrate.

At block 1806, the substrate is held within a controlled atmosphere environment. As described above, as the substrate is held within the controlled atmosphere environment, the substrate is transferred from the processing module used to expose the substrate to the bromine and/or hydrogen radicals (e.g., the surface treatment processing module 200) to the processing module that is used to perform the next processing step (e.g., the ALD processing module 300 or the PVD processing module 400).

At block 1808, an oxide layer is formed above the substrate. As described above, the oxide layer may be formed via, for example, ALD or PVD. In some embodiments, the oxide layer includes aluminum oxide. In some embodiments, the oxide layer includes zinc (e.g., indium gallium zinc oxide, cadmium zinc oxide, and/or germanium zinc oxide). At block 1810, the method 1800 ends. However, as described above, additional processing steps may be performed.

Thus, in some embodiments, a method for forming a semiconductor device is provided. A semiconductor substrate is provided. The semiconductor substrate is exposed to bromine radicals, hydrogen radicals, or a combination thereof. An oxide layer is formed above the semiconductor substrate. The semiconductor substrate is held within a controlled atmosphere at least from the completion of the exposing of the semiconductor substrate to bromine radicals, hydrogen radicals, or a combination thereof and the beginning of the forming of the oxide layer.

In some embodiments, a method for forming a semiconductor device is provided. A semiconductor substrate having a source region and a drain region is provided. An oxide layer is formed above the source region and the drain region. The oxide layer includes zinc. A metal layer is formed above the oxide layer and over the source region and the drain region. Contacts are formed above the metal layer and respectively over the source region and the drain region.

In some embodiments, a substrate processing system is provided. The substrate processing system includes a first processing chamber, a second processing chamber, and a vacuum chamber. The first processing chamber is configured to expose a substrate to bromine radicals, hydrogen radicals, or a combination thereof. The second processing chamber configured to perform an ALD process on the substrate. The vacuum chamber is coupled to the first processing chamber and the second processing chamber and configured to hold the substrate in a controlled atmosphere while the substrate is transported therethrough between the first processing chamber and the second processing chamber.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method for forming a semiconductor device, the method comprising:
   providing a semiconductor substrate;
   exposing the semiconductor substrate to bromine radicals; and
   forming an oxide layer above the semiconductor substrate after the exposing of the semiconductor substrate to the bromine radicals,
   wherein the semiconductor substrate is held within a controlled atmosphere at least from the completion of the exposing and the beginning of the forming of the oxide layer.

2. The method of claim 1, wherein the exposing occurs in a first processing chamber and the forming occurs in a second processing chamber, and further comprising transporting the semiconductor substrate from the first processing chamber to the second processing chamber.

3. The method of claim 2, wherein the first processing chamber and the second processing chamber are coupled to a vacuum chamber, and wherein the transporting of the semiconductor substrate from the first processing chamber to the second processing chamber comprising transporting the semiconductor substrate through the vacuum chamber.

4. The method of claim 1, wherein the semiconductor substrate comprises a doped region, the exposing of the semiconductor substrate comprises exposing the doped region to the bromine radicals, and the oxide layer is formed directly on the doped region of the semiconductor substrate.

5. The method of claim 4, wherein the oxide layer comprises indium-gallium-zinc oxide, cadmium-zinc oxide, germanium-zinc oxide, or a combination thereof.

6. The method of claim 4, further comprising forming a titanium-containing layer directly on the oxide layer, wherein the titanium-containing layer comprises titanium sulfide, titanium selenide, or a combination thereof.

7. The method of claim 6, further comprising;
    forming a dielectric layer directly on the titanium-containing layer, wherein the dielectric layer comprises titanium nitride; and
    forming a metallic contact above the dielectric layer.

8. The method of claim 1, wherein the substrate comprises germanium, gallium arsenide, or a combination thereof, and the oxide layer comprises aluminum oxide and is formed directly on the semiconductor substrate.

9. The method of claim 8, wherein the forming of the oxide layer comprises:
    exposing the semiconductor substrate to an oxidant, wherein the oxidant comprises water vapor, hydrogen peroxide gas, ozone gas, or a combination thereof; and
    exposing the semiconductor substrate to an aluminum precursor only after the exposing of the substrate to the oxidant.

10. The method of claim 9, further comprising:
    forming a high-k dielectric layer directly on the oxide layer, wherein the oxide layer and the high-k dielectric layer jointly form a gate dielectric layer; and
    forming a gate electrode directly on the gate dielectric layer, wherein the gate electrode comprises titanium nitride,
    wherein the semiconductor substrate further comprises source and drain regions formed within and the gate dielectric layer is on the semiconductor substrate between the source and drain regions.

11. A method for forming a semiconductor device, the method comprising:
    providing a semiconductor substrate comprising a doped region;
    exposing the doped region of the semiconductor substrate to bromine radicals, hydrogen radicals, or a combination thereof; and
    forming an oxide layer directly on the doped region of the semiconductor substrate after the exposing of the doped region to the bromine radicals, hydrogen radicals, or a combination thereof, wherein the oxide layer comprises indium-gallium-zinc oxide, cadmium-zinc oxide, germanium-zinc oxide, or a combination thereof, and wherein the semiconductor substrate is held within a controlled atmosphere at least from the completion of the exposing and the beginning of the forming of the oxide layer;
    forming a titanium-containing layer directly on the oxide layer, wherein the titanium-containing layer comprises titanium sulfide, titanium selenide, or a combination thereof;
    forming a dielectric layer directly on the titanium-containing layer, wherein the dielectric layer comprises titanium nitride; and
    forming a metallic contact above the dielectric layer.

12. The method of claim 11, further comprising:
    forming a gate dielectric layer on the substrate adjacent to the doped region; and
    forming a gate electrode above the gate dielectric layer.

13. The method of claim 11, wherein the exposing of the doped region to bromine radicals, hydrogen radicals, or a combination thereof comprises exposing the doped region to bromine radicals.

14. A method for forming a semiconductor device, the method comprising:
    providing a semiconductor substrate, wherein the semiconductor substrate comprises germanium, gallium arsenide, or a combination thereof and has source and drain regions formed within;
    exposing the semiconductor substrate to bromine radicals, hydrogen radicals, or a combination thereof; and
    forming an oxide layer directly on the semiconductor substrate between the source and drain regions after the exposing of the semiconductor substrate to the bromine radicals, wherein the forming of the oxide layer comprises:
        exposing the semiconductor substrate to an oxidant, wherein the oxidant comprises water vapor, hydrogen peroxide gas, ozone gas, or a combination thereof; and
        exposing the semiconductor substrate to an aluminum precursor only after the exposing of the substrate to the oxidant,
        wherein the semiconductor substrate is held within a controlled atmosphere at least from the completion of the exposing and the beginning of the forming of the oxide layer;
    forming a high-k dielectric layer directly on the oxide layer, wherein the oxide layer and the high-k dielectric layer jointly form a gate dielectric layer; and
    forming a gate electrode directly on the gate dielectric layer, wherein the gate electrode comprises titanium nitride.

15. The method of claim 14, wherein the exposing of the semiconductor substrate to bromine radicals, hydrogen radicals, or a combination thereof comprises exposing the semiconductor substrate to bromine radicals.

* * * * *